US012727190B2

(12) United States Patent
Lee et al.

(10) Patent No.: US 12,727,190 B2
(45) Date of Patent: Sep. 1, 2026

(54) SEMICONDUCTOR DEVICE INCLUDING INCLINED CHANNEL LAYER AND ELECTRONIC DEVICE INCLUDING THE SEMICONDUCTOR DEVICE

(71) Applicant: Samsung Electronics Co., Ltd., Suwon-si (KR)

(72) Inventors: Eunkyu Lee, Suwon-si (KR); Keunwook Shin, Suwon-si (KR); Minsu Seol, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 354 days.

(21) Appl. No.: 18/347,929

(22) Filed: Jul. 6, 2023

(65) Prior Publication Data

US 2024/0178294 A1 May 30, 2024

(30) Foreign Application Priority Data

Nov. 25, 2022 (KR) ........................ 10-2022-0160791

(51) Int. Cl.
*H10D 30/00* (2025.01)
*H10D 30/01* (2025.01)
(Continued)

(52) U.S. Cl.
CPC ....... *H10D 30/502* (2025.01); *H10D 30/0191* (2025.01); *H10D 30/481* (2025.01);
(Continued)

(58) Field of Classification Search
CPC .... H10D 30/6735; H10D 62/84; H10D 30/43; H10D 62/121; H10D 30/502;
(Continued)

(56) References Cited

U.S. PATENT DOCUMENTS 6,794,718 B2 * 9/2004 Nowak ............. H10D 84/0167 438/149
7,229,884 B2 6/2007 Park
(Continued)

FOREIGN PATENT DOCUMENTS

KR 10-2005-0112430 A 11/2005
KR 10-2006-0037561 A 5/2006
(Continued)

OTHER PUBLICATIONS

Korean Office Action dated Apr. 30, 2026 for corresponding Korean Patent Application No. 10-2022-0160791 and its English-language translation.

*Primary Examiner* — Earl N Taylor
(74) *Attorney, Agent, or Firm* — Harness, Dickey & Pierce, P.L.C.

(57) ABSTRACT

A semiconductor device may include a first electrode and a second electrode on a substrate and arranged perpendicular to a surface of the substrate, a plurality of channel layers between the first electrode and the second electrode, and a gate electrode surrounding the plurality of channel layers. The plurality of channel layers may be inclined with respect to a direction from the first electrode to the second electrode. An electronic device may include the semiconductor device.

18 Claims, 13 Drawing Sheets

(51) Int. Cl.
*H10D 30/47* (2025.01)
*H10D 30/67* (2025.01)
*H10D 62/10* (2025.01)
*H10D 84/85* (2025.01)

(52) U.S. Cl.
CPC ..... *H10D 30/6729* (2025.01); *H10D 30/6757* (2025.01); *H10D 62/121* (2025.01); *H10D 62/122* (2025.01); *H10D 84/851* (2025.01)

(58) Field of Classification Search
CPC ............. H10D 30/481; H10D 30/6729; H10D 30/6757; H10D 62/122; H10D 84/851; H01L 29/42392; H01L 29/0673; H01L 29/18; H01L 29/41733; H01L 29/775; H01L 29/78696
See application file for complete search history.

(56) References Cited

U.S. PATENT DOCUMENTS 7,427,788 B2 9/2008 Li et al.
7,667,300 B2 * 2/2010 Zhang ................ H10D 84/0128 257/E29.136
7,847,320 B2 * 12/2010 Anderson .............. H10D 89/10 257/202
7,968,674 B2 6/2011 Choi et al.
7,988,941 B2 8/2011 Choi et al.
8,012,819 B2 * 9/2011 Zhang ................ H10D 84/0128 257/E21.409
8,133,466 B2 3/2012 Shin et al.
8,283,038 B2 10/2012 Choi et al.
8,535,553 B2 9/2013 Kong et al.
8,623,761 B2 1/2014 Bonilla et al.
8,723,024 B2 5/2014 Choi et al.
8,895,433 B2 11/2014 Bonilla et al.
8,906,787 B2 12/2014 Park et al.
8,912,530 B2 12/2014 Yang et al.
8,980,759 B1 3/2015 Corrion et al.
9,040,957 B2 5/2015 Lee et al.
9,056,424 B2 6/2015 Wenxu et al.
9,064,777 B2 6/2015 Heo et al.
9,108,848 B2 8/2015 Woo et al.
9,324,634 B2 4/2016 Bao et al.
9,324,635 B2 4/2016 Bao et al.
9,359,211 B2 6/2016 Woo et al.
9,425,291 B1 * 8/2016 Balakrishnan ......... H10D 84/83
9,472,450 B2 10/2016 Bonilla et al.
9,527,043 B2 12/2016 Choi et al.
9,533,265 B2 1/2017 Choi et al.
9,583,358 B2 2/2017 Kim et al.
9,721,734 B2 8/2017 Ryu et al.
9,876,088 B1 * 1/2018 Van Dal .............. H01L 21/0262
10,263,073 B2 * 4/2019 Van Dal ................. B82Y 10/00
10,325,987 B2 6/2019 Park et al.
10,622,486 B2 * 4/2020 Hashemi ........... H01L 21/02381
11,515,430 B2 * 11/2022 Hashemi ........... H01L 21/02381
12,382,665 B2 * 8/2025 Xie .................... H10D 30/6735
2008/0030838 A1 * 2/2008 Moselund ............... G02F 1/025 359/279
2010/0112763 A1 * 5/2010 Zhang ................ H10D 84/0128 257/E21.409
2010/0187503 A1 * 7/2010 Moriyama ............. H10D 30/62 438/479
2011/0073842 A1 * 3/2011 Liu ........................ B82Y 10/00 438/149
2011/0127471 A1 6/2011 Shin et al.
2013/0059155 A1 3/2013 Choi et al.
2014/0087191 A1 3/2014 Chua et al.
2015/0235959 A1 8/2015 Lee et al.
2016/0204276 A1 * 7/2016 Dasgupta ............. H10D 62/405 438/150
2017/0170269 A1 * 6/2017 Balakrishnan ..... H10D 30/6757
2018/0151669 A1 * 5/2018 Van Dal ............... H10D 62/115
2019/0035940 A1 * 1/2019 Hashemi ........... H01L 21/02502
2020/0212228 A1 * 7/2020 Hashemi ........... H01L 21/02603
2021/0367032 A1 11/2021 Chen et al.
2022/0157811 A1 5/2022 You et al.
2023/0093025 A1 * 3/2023 Xie .................... H10D 30/6735 257/401
2023/0178598 A1 * 6/2023 Ando ................... H10D 84/014 257/288
2023/0361175 A1 * 11/2023 Xu ....................... H10D 62/121
2024/0105801 A1 * 3/2024 Guler .................. H01L 29/0673
2025/0159953 A1 * 5/2025 Ghani ................. H01L 25/0655

FOREIGN PATENT DOCUMENTS

KR 10-2015-0000115 A 1/2015
KR 10-2019-0075630 A 7/2019
KR 20210117004 A * 9/2021 ......... H10D 30/6735
KR 10-2022-0068283 A 5/2022
KR 10-2426249 B1 7/2022
WO WO-2018/009931 A1 1/2018

* cited by examiner

SEMICONDUCTOR DEVICE INCLUDING INCLINED CHANNEL LAYER AND ELECTRONIC DEVICE INCLUDING THE SEMICONDUCTOR DEVICE

CROSS-REFERENCE TO RELATED APPLICATIONS

This application is based on and claims priority under 35 U.S.C. § 119 to Korean Patent Application No. 10-2022-0160791, filed on Nov. 25, 2022 in the Korean Intellectual Property Office, the disclosure of which is incorporated by reference herein in its entirety.

BACKGROUND

1. Field

The present disclosure relates to a semiconductor device including an inclined channel layer and an electronic device including the semiconductor device.

2. Description of the Related Art

A transistor, which is a semiconductor device operating as an electric switch, has been used for various semiconductor products such as memories, driving integrated circuits (ICs), etc. As the size of semiconductor devices decreases, the number of semiconductor devices that may be integrated on a single wafer may increase and a driving speed of the semiconductor devices may increase. Thus, research for reducing the size of semiconductor devices has been actively conducted.

A structure of a transistor used in a semiconductor device has evolved from a sheet to a gate-all-around (GAA) structure via a fin field-effect transistor (FinFET) structure. A multi-bridge channels (MBC)-FET, which is a type of the GAA structure that has just begun to be introduced, responds to deterioration caused by a short channel effect corresponding to an increase of integration of the semiconductor device through a structure wherein plate thin channels are vertically stacked.

SUMMARY

Provided is a semiconductor device including a plurality of channel layers that are provided between a first electrode and a second electrode arranged perpendicular to a surface of a substrate and arranged at a certain angle with respect to the surface of the substrate and inclined with respect to a direction from the first electrode to the second electrode.

Provided is a semiconductor device including a plurality of channel layers that are provided between a first electrode and a second electrode arranged perpendicular to a surface of a substrate and arranged at a certain angle with respect to the surface of the substrate and inclinedly with respect to a direction perpendicular to a direction from the first electrode to the second electrode.

However, features and aspects of semiconductor devices according to example embodiments are not limited to those discussed above.

Additional aspects will be set forth in part in the description which follows and, in part, will be apparent from the description, or may be learned by practice of the presented embodiments of the disclosure.

According to an example embodiment, a semiconductor device may include a substrate; a first electrode and a second electrode on the substrate and arranged perpendicular to a surface of the substrate; a plurality of channel layers between the first electrode and the second electrode; and a gate electrode surrounding the plurality of channel layers. The plurality of channel layers may be inclined with respect to a direction from the first electrode to the second electrode.

In some embodiments, the substrate may include an inclined surface and the plurality of channel layers may be parallel to the inclined surface.

In some embodiments, the first electrode and the second electrode may be a source electrode and a drain electrode, respectively.

In some embodiments, each of the plurality of channel layers may be symmetric with respect to a center line extending through the plurality of channel layers in a direction crossing the plurality of channel layers.

In some embodiments, each of the plurality of channel layers may include a two-dimensional (2D) semiconductor material.

In some embodiments, the 2D semiconductor material may include transition metal dichalcogenide (TMD), black phosphorus, or graphene.

In some embodiments, the first electrode and the second electrode each independently may include at least one of metal, a metal nitride, metal carbide, polysilicon, or a combination thereof.

In some embodiments, each semiconductor device may include a gate insulating layer between the plurality of channel layers and the gate electrode.

In some embodiments, the gate electrode may include at least one of metal, a conductive nitride, or a conductive oxide.

In some embodiments, the semiconductor device may include a third electrode perpendicular to the surface of the substrate. The third electrode may be between the first electrode and the second electrode.

In some embodiments, the first electrode and the second electrode each may be a source electrode, and the third electrode may be a common drain electrode.

In some embodiments, the plurality of channel layers may include a plurality of first channel layers between the first electrode and the third electrode and a plurality of second channel layers between the second electrode and the third electrode.

In some embodiments, the plurality of first channel layers and the plurality of second channel layers may be symmetrical with respect to the third electrode.

According to an example embodiment, a semiconductor device may include a substrate; a first electrode and a second electrode on the substrate and spaced apart from each other in a first direction, the first direction parallel to a bottom surface of the substrate, the first electrode and the second electrode extending in a second direction, the second direction being perpendicular to the bottom surface of the substrate; a plurality of channel layers between the first electrode and the second electrode, the plurality of channel layers being inclined at an angle with respect to the bottom surface of the substrate; and a gate electrode surrounding the plurality of channel layers.

In some embodiments, the substrate may include an inclined surface and the plurality of channel layers may be parallel to the inclined surface.

In some embodiments, the first electrode and the second electrode may be a source electrode and a drain electrode, respectively.

In some embodiments, the semiconductor device may include a third electrode perpendicular to a surface of the substrate. The third electrode may be between the first electrode and the second electrode.

In some embodiments, the first electrode and the second electrode each may be a source electrode, and the third electrode may be a common drain electrode.

In some embodiments, an electronic device may include any one of the semiconductor devices described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
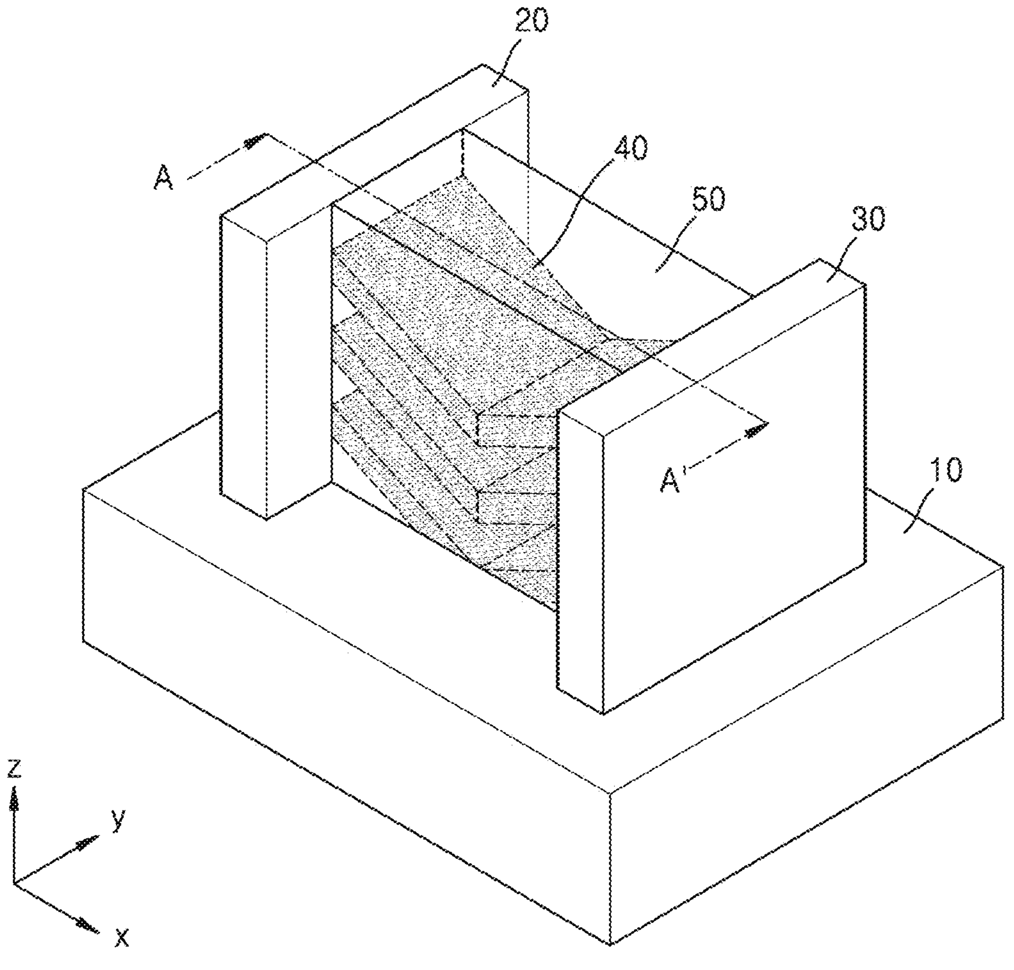
FIG. 1 is a perspective view of a semiconductor device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, various embodiments disclosed herein will be described in detail with reference to the accompanying drawings. In the drawings, like reference numerals denote like components, and sizes of components in the drawings may be exaggerated for convenience of explanation. Meanwhile, embodiments of the disclosure to be described are merely examples, and various modifications may be made from such embodiments of the disclosure.

The terms "above" and "on" may mean not only "contact directly on/under/at left/right", but also "contact on/under/at left/right". Singular forms include plural forms unless apparently indicated otherwise contextually. When a portion is referred to as "comprises" a component, the portion may not exclude another component but may further include another component unless stated otherwise.

The use of the terms of "the above-described" and similar indicative terms may correspond to both the singular forms and the plural forms. When there is an explicit description of the order of operations of the method or there is no description contrary thereto, these operations may be performed in an appropriate order and the order is not necessarily limited to the described order.

The term used herein such as "unit" or "module" indicates a unit for processing at least one function or operation, and may be implemented in hardware, software, or in a combination of hardware and software.

Connections of lines or connection members between components shown in the drawings are illustrative of functional connections and/or physical or circuit connections, and in practice, may be represented as alternative or additional various functional connections, physical connections, or circuit connections.

The use of all examples or example terms is only to describe technical spirit in detail, and the scope is not limited by these examples or terms unless limited by the claims.

FIG. 1 is a perspective view of a semiconductor device according to an example embodiment.

Referring to FIG. 1, a semiconductor device 1 may include a substrate 10, a first electrode 20 and a second electrode 30 that are arranged perpendicular to a surface of the substrate 10, a plurality of channel layers 40 provided between the first electrode 20 and the second electrode 30 and arranged inclined at a certain angle with respect to the surface of the substrate 10, and a gate electrode 50 provided to surround the plurality of channel layers 40, in which the plurality of channel layers 40 may be provided inclined with respect to a direction A-A' from the first electrode 20 to the second electrode 30. Although not shown in FIG. 1, a gate insulating layer (not shown) may be further provided between the gate electrode 50 and the plurality of channel layers 40.

The substrate 10 according to an example embodiment may include at least one selected from silicon (Si), germanium (Ge), silicon germanium (SiGe), and a group III-V semiconductor. The substrate 10 may also include a silicon on insulator (Sol) type. However, the disclosure is not limited thereto.

The substrate 10 may include an inclined surface formed by being etched inclined at a certain angle from the surface of the substrate 10, and the plurality of channel layers 40 may be arranged in parallel to the inclined surface. However, the plurality of channel layers 40 may be arranged not to be parallel to the inclined surface without being limited to being arranged in parallel to the inclined surface.

The certain angle from the surface of the substrate 10 to the inclined surface may be greater than 0 degree and less than 90 degrees, and an effect of extending an effective channel layer length to the longest may be obtained at an inclination of 55 degrees.

Etching may be performed by forming a thin oxide film on the substrate 10 to form a pattern with photoresist, and then removing an unnecessary thin film through an etching process. The etching process may include wet etching using hydrofluoric acid liquid and dry etching using a tetrafluoromethane gas. In addition, sputtering etching using a sputtering method may be provided. However, the disclosure is not limited thereto.

The semiconductor device 1 according to an example embodiment may include a field effect transistor (FET). With technical development, the semiconductor device 1 has evolved from a sheet to a gate-all-around (GAA) structure through a fin structure to manufacture a high-integration transistor. A multi-bridge channel (MBC) FET is a type of a GAA transistor structure and may mean a structure in which a plurality of thin channel layers in a sheet form are vertically stacked. For the semiconductor device 1, the length of the channel layer gradually decreases with the improvement of the integration, in which a transistor including a channel layer of an excessively short length may undergo degradation of an on/off operation thereof due to a short channel effect.

In the semiconductor device 1 according to an example embodiment, to address such a weak point, the plurality of channel layers 40 may be arranged inclined with respect to the direction A-A' from the first electrode 20 to the second electrode 30 such that an actual effective channel layer length may be increased over to a planar view channel length and the short channel effect that is the weak point of the high-integration semiconductor device may be reduced.

The plurality of channel layers 40 according to an example embodiment may be symmetric with respect to a center portion arranged between the first electrode 20 and the second electrode 30. The plurality of channel layers 40 may be symmetric with respect to a center line extending through the plurality of channel layers in a direction crossing the plurality of channel layers 40 (e.g., a direction parallel to the first electrode 20). When the plurality of channel layers 40 are symmetric to one another, the aforementioned effective channel layer length may increase the most, and thus the short channel effect may be reduced the most. However, the plurality of channel layers 40 may not be necessarily symmetric to one another.

The plurality of channel layers 40 according to an example embodiment may include a two-dimensional (2D) semiconductor material. The plurality of channel layers 40 may be formed in a nanosheet form that may include a 2D semiconductor material. The 2D material may mean a material having a layered structure in which constituent atoms are two-dimensionally coupled. The 2D material having semiconductor characteristics may have an electrical property and maintain high mobility without a large change in characteristics thereof even when the thickness thereof decreases to a nanoscale. A channel layer including the 2D semiconductor material may include a material having a band gap of about 0.1 eV to about 3.0 eV. For example, the 2D semiconductor material may include transition metal dichalcogenide (TMD), black phosphorus, and graphene. However, the disclosure is not limited thereto.

TMD, which is a 2D material having semiconductor characteristics, may be a compound of a transition metal and a chalcogen element. Herein, the transition metal may include at least one of, for example, molybdenum (Mo), tungsten (W), niobium (Nb), vanadium (V), tantalum (Ta), titanium (Ti), zirconium (Zr), hafnium (Hf), carbon monoxide (Co), technetium (Tc), and rhenium (Re), and the chalcogen element may include at least one of, for example, sulfur (S), selenium (Se), and tellurium (Te). As a detailed example, TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and so forth. However, the present disclosure is not limited thereto. Black phosphorus may be a semiconductor material having a structure in which phosphorus (P) atoms are two-dimensionally coupled.

The gate electrode 50 according to an example embodiment may be arranged between the first electrode 20 and the second electrode 30. The gate electrode 50 may be formed to surround the circumference of the plurality of channels 40, and this form may be referred to as a transistor having a GAA structure. That is, the gate electrode 50 may be formed to completely surround the periphery of the plurality of channel layers 40.

The gate electrode 50 may include at least one of metal, a conductive nitride, or a conductive oxide. For example, the gate electrode 50 may include at least one selected from aurum (Au), Ti, titanium nitride (TiN), tantalum nitride (TaN), W, Mo, tungsten nitride (WN), platinum (Pt), and nickel (Ni). The conductive oxide may include, for example, indium tin oxide (ITO), indium zinc oxide (IZO), etc. However, this is merely an example.

The first electrode 20 and the second electrode 30 according to an example embodiment may be a source electrode and a drain electrode, respectively.

The source electrode and the drain electrode may be provided on both sides of the gate electrode 50. The source electrode and the drain electrode may be provided on a source region and a drain region. The source electrode and the drain electrode may include, but not limited to, a metal material, etc., having excellent electric conductivity, such as argentum (Ag), aurum (Au), platinum (Pt), copper (Cu), etc.

Figure 2A:
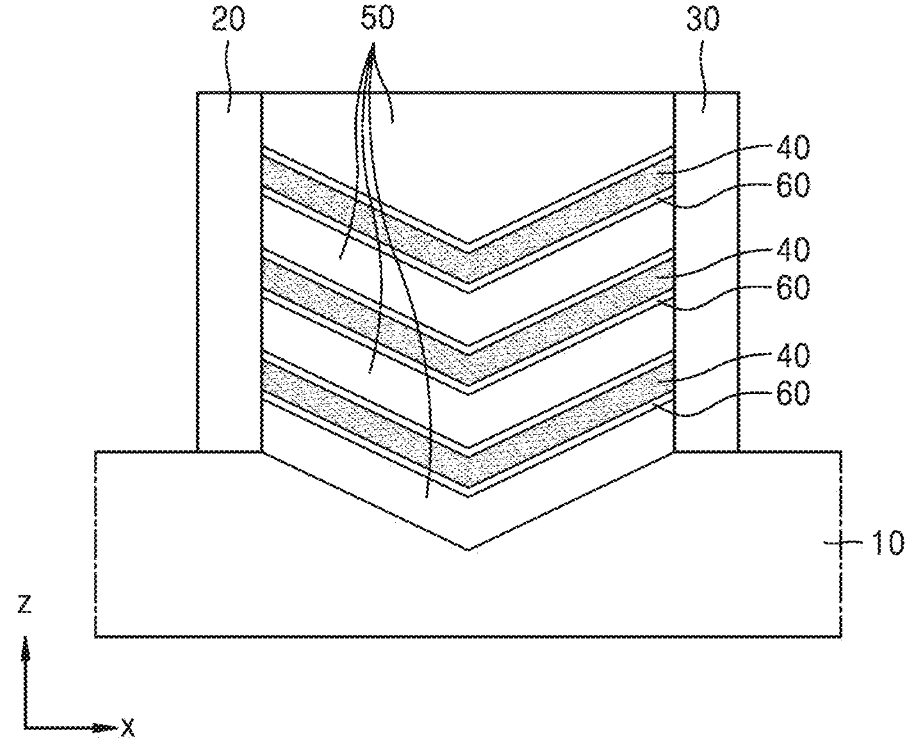
FIG. 2A is a view showing a cross-section of a semiconductor device according to an example embodiment.

FIG. 2A is a view showing a cross-section of a semiconductor device according to an example embodiment.

FIG. 2A is a cross-sectional view in which the semiconductor device 1 of FIG. 1 is cut in the direction A-A' from the first electrode 20 to the second electrode 30.

As mentioned in FIG. 1, the substrate 10, the first electrode 20, the second electrode 30, the plurality of channel layers 40, and the gate electrode 50 formed to surround the plurality of channel layers 40 may be provided.

In the semiconductor device 1 according to an example embodiment, a gate insulating layer 60 may be arranged between the plurality of channel layers 40 and the gate electrode 50. The gate insulating layer 60 may include, but not limited to, a silicon nitride, etc.

Figure 2B:
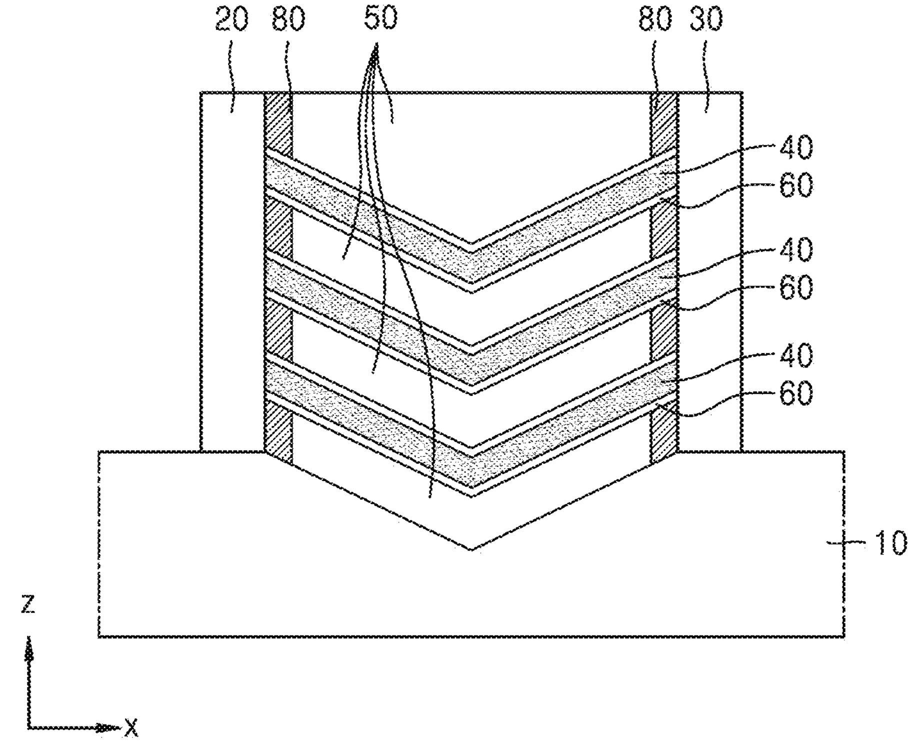
FIG. 2B is a view showing a cross-section of a semiconductor device according to an example embodiment.

Although not shown in FIGS. 1 and 2A, the gate electrode 50 may be separated and insulated from the first electrode 20 and second electrode 30. For example, as depicted in FIG. 2B, the gate electrode 50 may be spaced apart from the first electrode 20 and the second electrode 30. In some embodiments, an insulating spacer (or air gap) 80 may be between the gate electrode 50 and each of the first electrode 20 and the second electrode 30.

Figure 3:
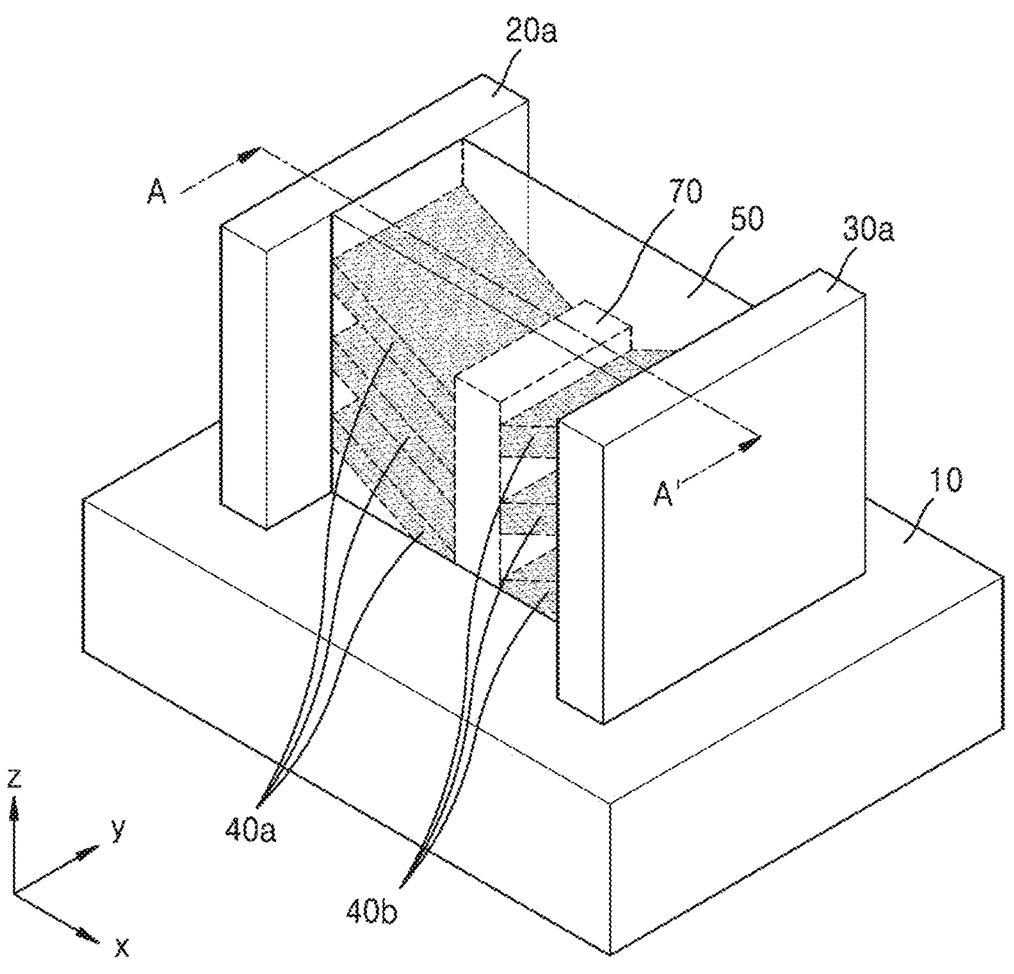
FIG. 3 is a perspective view of a semiconductor device according to an example embodiment.

FIG. 3 is a perspective view of a semiconductor device according to an example embodiment.

Referring to FIG. 3, a third electrode 70 may be further arranged perpendicular to the surface of the substrate 10 between the first electrode 20 and the second electrode 30 of FIG. 1.

A first electrode 20*a* and a second electrode 30*a* may be each a source electrode, and the third electrode 70 may be a common drain electrode.

According to an example embodiment, a first transistor (not shown) including the first electrode 20*a*, the third electrode 70, a common gate electrode 50, and a plurality of first channel layers 40*a* and a second transistor (not shown) including the second electrode 30*a*, the common gate electrode 50, and a plurality of channel layers 40*b* may constitute a CMOS device. The first transistor and the second transistor may include a first conductive material and a second conductive material, respectively, which may be doped with different polarities. The different polarities may include an n-type polarity and a p-type polarity. A single CMOS device where a first transistor and a second transistor are coupled will be described later.

The NMOSFET may mean a semiconductor device in which a source and a drain are doped with n-type polarity, and the PMOSFET may mean a semiconductor device in which a source and a drain are doped with p-type polarity.

The CMOS device may generally include both an NMOSFET and a PMOSFET. An example of the CMOS device may include a CMOS inverter. The CMOS inverter may be a circuit operating such that an output and an input are in opposite states. That is, the CMOS inverter may be a device that outputs 1 in response to an input of 0 and outputs 0 in response to an input of 1.

The semiconductor device according to an example embodiment may be formed by connecting a first transistor (not shown) and a second transistor (not shown) to each other, each of which includes three electrodes of a source electrode, a drain electrode, and a gate electrode. That is, the gate electrode may be shared between the first transistor and the second transistor, drain electrodes of which are bonded to form the third electrode 70 that is a common drain electrode, thus configuring an inverter.

Figure 4A:
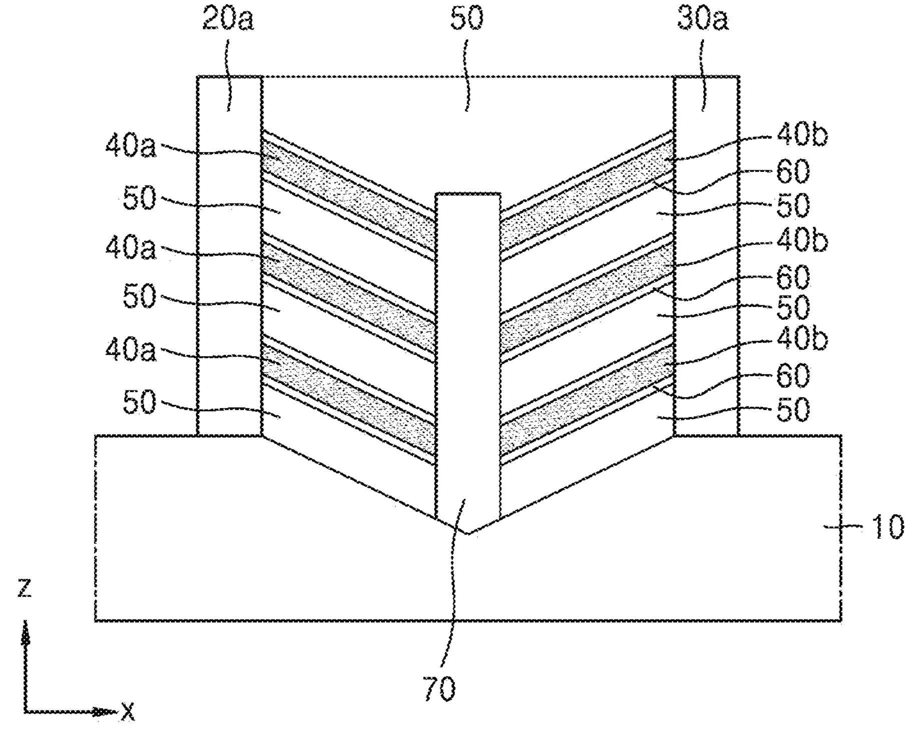
FIG. 4A is a view showing a cross-section of a semiconductor device according to an example embodiment.

FIG. 4A is a view showing a cross-section of a semiconductor device according to an example embodiment.

Referring to FIG. 4A, FIG. 4A is a cross-sectional view in which the semiconductor device of FIG. 3 is cut in the direction A-A' from the first electrode to the second electrode.

As mentioned with reference to FIG. 3, the substrate 10, the first electrode 20*a*, the second electrode 30*a*, the plurality of first channel layers 40*a*, a plurality of second channel layers 40*b*, and the common gate electrode 50 and the third electrode 70 formed to surround the plurality of first channel layers 40*a* and the plurality of second channel layers 40*b* may be provided.

In the semiconductor device according to an example embodiment, a gate insulating layer 60 may be arranged between the plurality of first and second channel layers 40*a* and 40*b* and the gate electrode 50. The gate insulating layer 60 may include, but not limited to, a silicon nitride, etc.

Figure 4B:
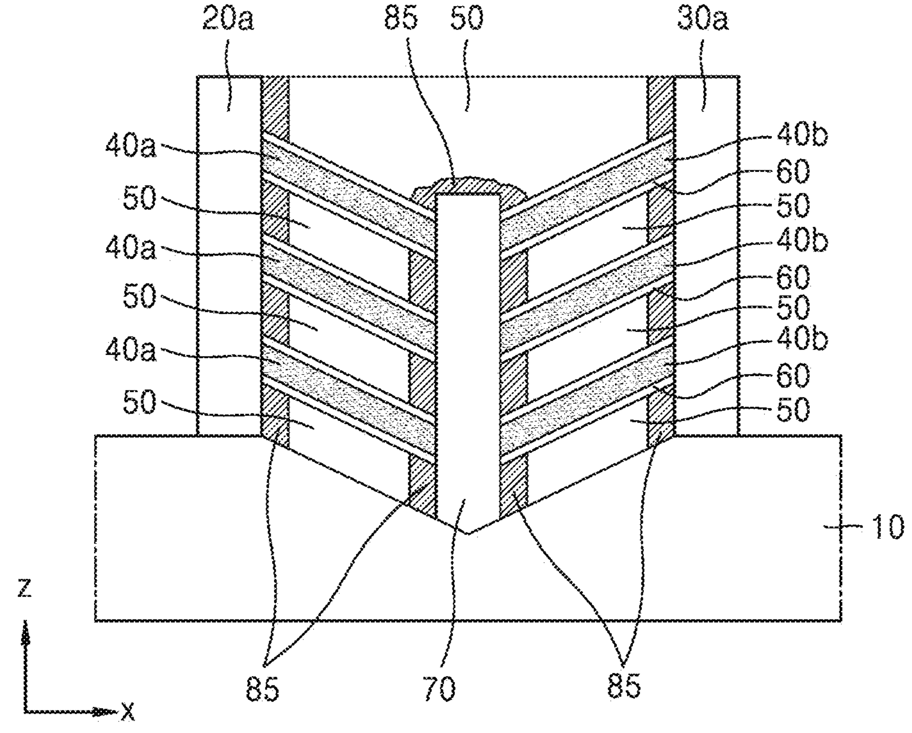
FIG. 4B is a view showing a cross-section of a semiconductor device according to an example embodiment.

Although not shown in FIGS. 3 and 4A, the gate electrode 50 may be separated and insulated from the first electrode 20*a*, second electrode 30*a*, and third electrode 70. For example, as depicted in FIG. 4B, the gate electrode 50 may be spaced apart from the first electrode 20*a*, second electrode 30*a*, and third electrode 70. In some embodiments, an insulating spacer (or air gap) 85 may be between the gate electrode 50 and each of the first electrode 20*a*, second electrode 30*a*, and third electrode 70.

The CMOS device formed by coupling the first transistor and the second transistor described with reference to FIGS. 3 and 4A (or 4B) with each other may operate as an inverter. A detailed matter will be described later with reference to FIG. 6.

Figure 5:
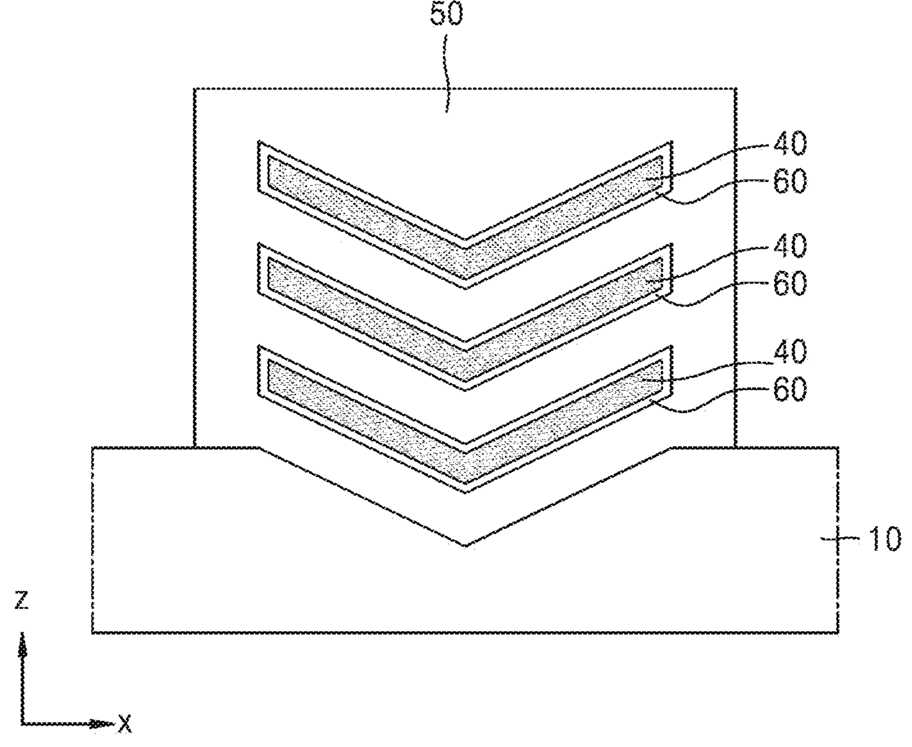
FIG. 5 is a view showing a cross-section of a semiconductor device according to an example embodiment.

FIG. 5 is a view showing a cross-section of a semiconductor device according to an example embodiment.

Referring to FIG. 5, the substrate 10, the first electrode (not shown), the second electrode (not shown), the plurality of channel layers 40 provided between the first electrode and the second electrode and arranged inclined at a certain angle with respect to a surface of the substrate 10, and the gate electrode 50 provided to surround the plurality of channel layers 40 may be provided, in which the plurality of channel layers 40 may be provided perpendicularly to a direction from the first electrode (not shown) to the second electrode (not shown).

More specifically, the plurality of channel layers are formed inclined in a direction perpendicular to the direction A-A' from the first electrode 20 to the second electrode 30 of FIG. 1, such that the plurality of channel layers 40 may be formed inclined in perpendicular to the direction A-A'.

The plurality of channel layers 40 of FIG. 1 may increase the effective channel length, whereas the plurality of channel layers 40 of FIG. 5 may increase the width of the plurality of channel layers 40 rather than increasing the effective channel length, allowing more current to flow per unit time and thus improving device performance without reducing the channel length.

Although not shown in FIG. 5, in some embodiments, the first electrode 20 and second electrode 30 may be spaced apart from the gate electrode 50 and on the substrate 10. An insulating spacer 80 or air gap (see FIG. 2B) may be between the gate electrode 50 and each of the first electrode 20 and the second electrode 30.

Figure 6:
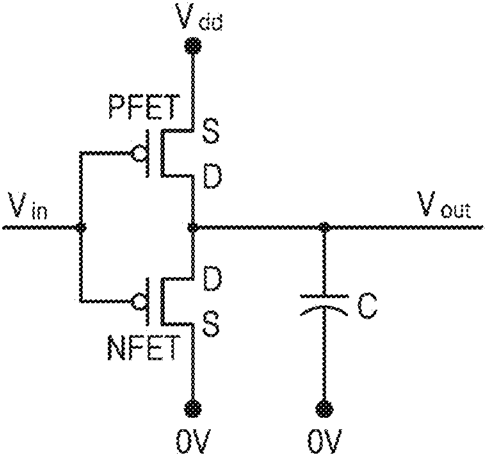
FIGS. 6 and 7 are respectively a circuit diagram and a layout cross-sectional and top schematic diagrams of a general complementary metal-oxide semiconductor (CMOS) inverter.
Figure 7:
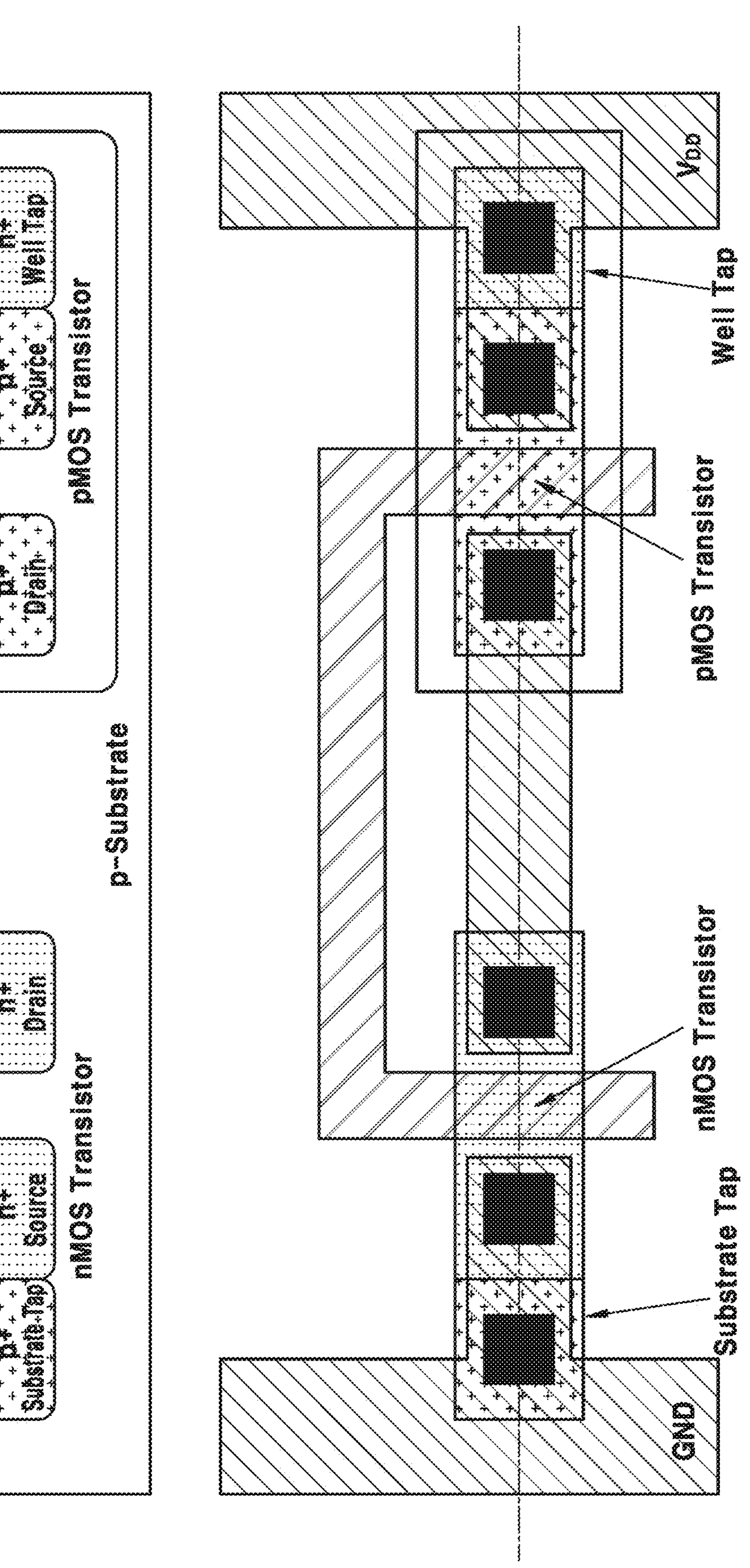

FIGS. 6 and 7 are respectively a circuit diagram and a layout cross-sectional and top schematic diagrams of a general CMOS inverter.

FIG. 6 is a circuit diagram of a general CMOS inverter. The CMOS inverter may have a structure in which gates of an N-channel MOS field effect transistor (NMOSFET) and a P-channel MOSFET are connected to receive an input voltage $V_{in}$ and drains of the NMOSFET and the PMOSFET are connected to output an output voltage $V_{out}$. A source of the NMOSFET may be grounded (0V, GND), and a source of the PMOSFET may be connected to a supply power source $V_{dd}$. Referring to the operating principle of the CMOS inverter, when an input voltage $V_{in}$ is 0 V, current flows through the PMOSFET without flowing through the NMOSFET, such that the voltage $V_{dd}$ applied to the source of the PMOS may be output (on state). On the other hand, when the input voltage $V_{in}$ is $V_{dd}$, current may flow through the NMOSFET without flowing through the PMOSFET, such that a voltage of 0 V applied to the source of the NMOS may be output (off state). That is, in the CMOS inverter, one of the NMOSFET and the PMOSFET operates with the input voltage $V_{in}$, enabling low-power circuit designing.

FIG. 7 is a layout schematic diagram of the general CMOS inverter. As the NMOSFET and the PMOSFET are horizontally arranged on the substrate, a layout area occupied by a device increases, making it difficult to implement high integration.

Thus, a method for reducing a layout area occupied by a device by stacking an NMOSFET and a PMOSFET on a substrate may be proposed. However, when both the NMOSFET and the PMOSFET include a semiconductor material such as Si, a lower MOSFET may be deteriorated due to a high-temperature process required to form a silicon channel layer or a source/drain of an upper MOSFET (to dope and activate impurity).

Figure 8:
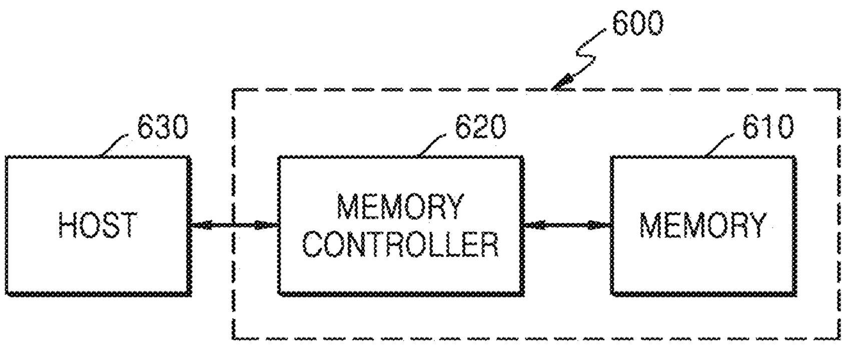
FIG. 8 is a block diagram of an electronic device according to an example embodiment.

FIG. 8 is a block diagram of an electronic device 600 according to an example embodiment.

Referring to FIG. 8, the electronic device 600 may include a memory 610 and a memory controller 620. The memory controller 620 may control the memory 610 for data reading from the memory 610 and/or data writing to the memory 610, in response to a request of a host 630. The memory 610 may include a semiconductor device according to the above-described embodiments.

Figure 9:
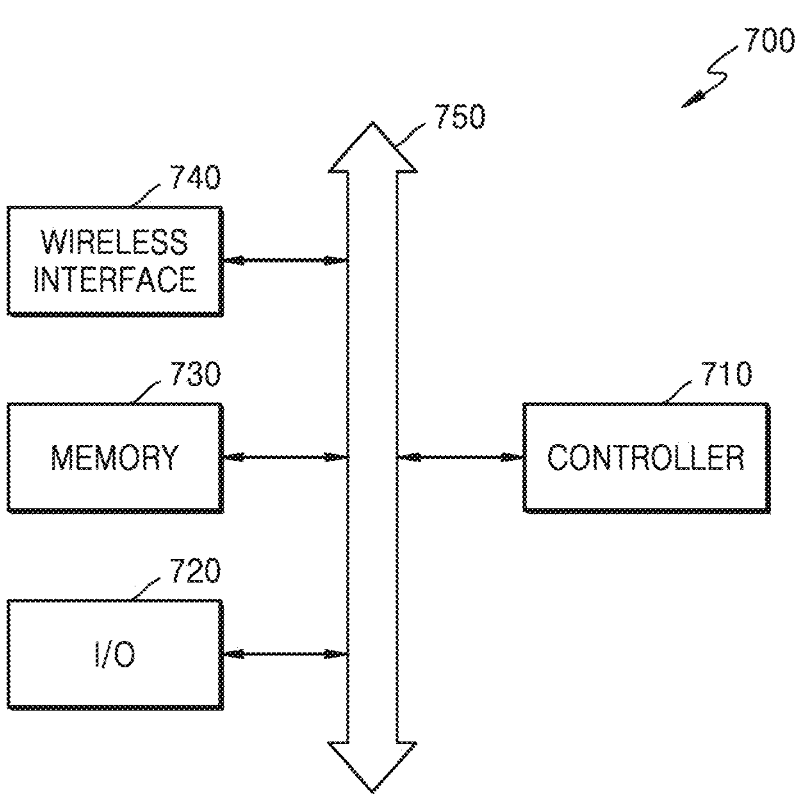
FIG. 9 is a block diagram of an electronic device according to an example embodiment.

FIG. 9 is a block diagram of an electronic device 700 according to an example embodiment.

Referring to FIG. 9, the electronic device 700 may constitute a wireless communication device or a device capable of transmitting and/or receiving information in a wireless environment. The electronic device 700 may include a controller 710, an input/output device I/O 720, a memory 730, and a wireless interface 740, which are connected to one another through a bus 750.

The controller 710 may include at least one of a microprocessor, a digital signal processor, or a processing device similar thereto. The input/output device 720 may include at least one of a keypad, a keyboard, or a display. The memory 730 may be used to store a command executed by the controller 710. For example, the memory 730 may be used to store user data. The electronic device 700 may use the wireless interface 740 to transmit/receive data through a wireless communication network. The wireless interface 740 may include an antenna and/or a wireless transceiver. In some embodiments, the electronic device 700 may be used in a communication interface protocol of a third-generation communication system, such as code division multiple access (CDMA), global system for mobile communications (GSM), North American digital cellular (NADC), extended-time division multiple access (E-TDMA), and/or wide band code division multiple access (WCDMA), a 4G (4th Generation) communication system such as 4G LTE, a 5G (5th Generation) communication system, a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), and/or Power Line communication (PLC), etc. The memory 730 of the electronic device 700 may include a semiconductor device according to the above-described embodiments.

Figure 10:
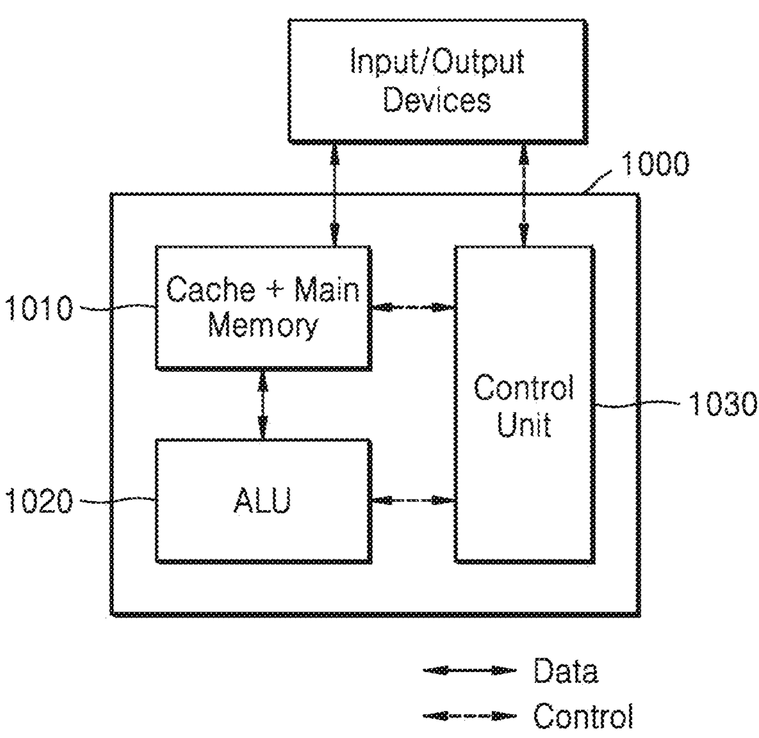
FIGS. 10 and 11 are conceptual views schematically showing a device architecture applicable to an electronic apparatus according to an example embodiment.
Figure 11:
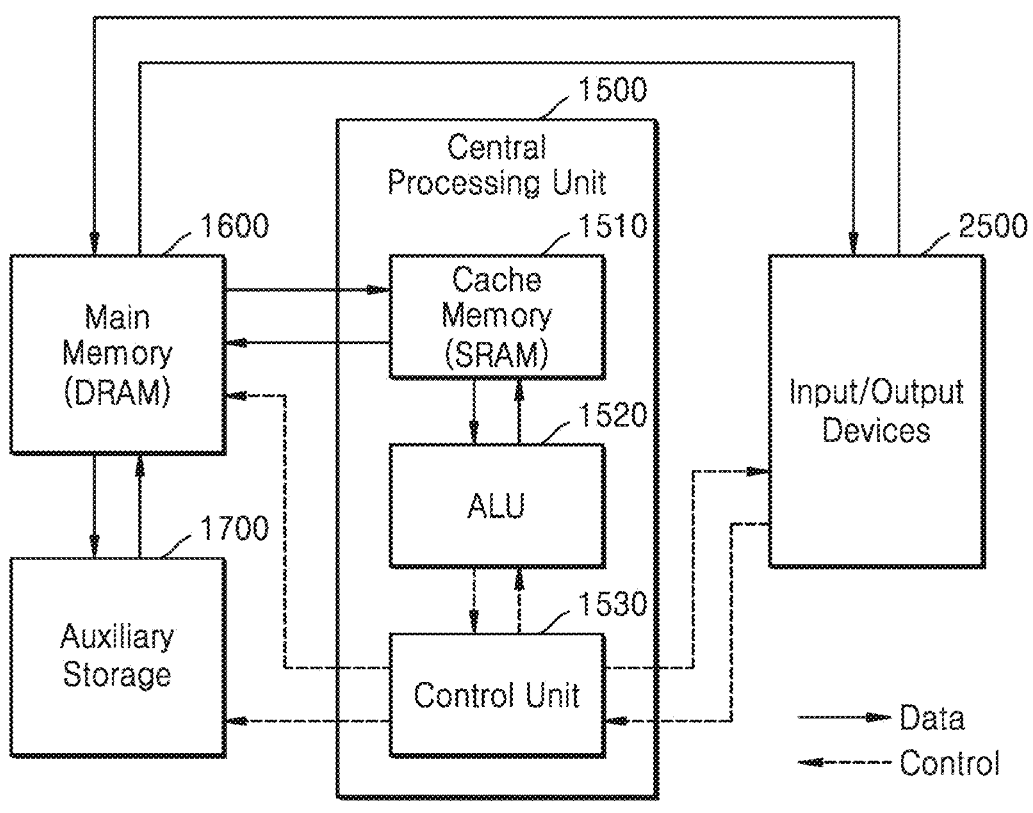

FIGS. 10 and 11 are conceptual views schematically showing a device architecture applicable to an electronic apparatus according to an embodiment.

Referring to FIG. 10, an electronic device architecture 1000 may include a memory unit 1010 and a control unit 1030, and may further include an arithmetic logic unit (ALU) 1020. The memory unit 1010, the ALU 1020, and the control unit 1030 may be electrically connected to one another. For example, the electronic device architecture 1000 may be implemented as one chip including the memory unit 1010, the ALU 1020, and the control unit 1030. More specifically, the memory unit 1010, the ALU 1020, and the control unit 1030 may communicate directly by being connected to one another through a metal line on-chip. The memory unit 1010, the ALU 1020, and the control unit 1030 may be monolithically integrated on one substrate to form one chip. An input/output device 2000 may be connected to the electronic device architecture (chip) 1000. The memory unit 1010 may include both a main memory and a cache memory. The electronic device architecture (chip) 1000 may be an on-chip memory processing unit. Each of the memory unit 1010, the ALU 1020, and/or the control unit 1030 may independently include the semiconductor device according to the above-described embodiments.

Referring to FIG. 11, a cache memory 1510, an ALU 1520, and a control unit 1530 may constitute a central processing unit (CPU) 1500, and the cache memory 1510 may include a static random access memory (SRAM). A main memory 1600 and an auxiliary storage 1700 may be included in addition to the CPU 1500, and an input/output device 2500 may also be included. The main memory 1600 may be, for example, a dynamic random access memory (DRAM), and may include the semiconductor device according to the above-described embodiments. The auxiliary storage 1700 and cache memory 1510 may include the semiconductor device according to the above-described embodiments.

Depending on a circumstance, the electronic device architecture may be implemented in a form where computing-unit devices and memory-unit devices are adjacent to each other in one chip, without distinction of sub-units.

A semiconductor device according to an example embodiment may include a first electrode and a second electrode arranged perpendicular to a surface of a substrate, a plurality of channel layers provided between the first electrode and the second electrode and arranged inclined at a certain angle with respect to the surface of the substrate, and a gate electrode provided to surround the plurality of channel layers, in which the plurality of channel layers may be provided inclined with respect to the direction from the first electrode to the second electrode. The plurality of channel layers arranged inclined at a certain angle may increase an effective channel layer length and reduce a short channel effect.

However, effects of the disclosure are not limited to the above disclosure.

While the semiconductor device and the electronic apparatus including the same described above have been described with reference to the embodiments described in the drawings, it will be understood by those of ordinary skill in the art that various modifications and equivalent other embodiments are possible therefrom. Therefore, the disclosed embodiments should be considered in a descriptive sense rather than a restrictive sense. The scope of the present specification is not described above, but in the claims, and all the differences in a range equivalent thereto should be interpreted as being included.

Although the embodiments have been described above, these are merely examples and various changes may be made therefrom by those of ordinary skill in the art.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:

a substrate;

a first electrode and a second electrode on the substrate and arranged perpendicular to a surface of the substrate;

a third electrode arranged perpendicular to the surface of the substrate;

a plurality of channel layers between the first electrode and the second electrode, the plurality of channel layers being inclined at an angle with respect to a direction from the first electrode to the second electrode; and a gate electrode surrounding the plurality of channel layers, wherein the third electrode is between the first electrode and the second electrode, the plurality of channel layers comprise a plurality of first channel layers between the first electrode and the third electrode and a plurality of second channel layers between the second electrode and the third electrode, the plurality of first channel layers and the plurality of second channel layers are symmetrical with respect to the third electrode, and the gate electrode surrounds the plurality of first channel layers and the plurality of second channel layers.

2. The semiconductor device of claim 1, wherein the substrate comprises an inclined surface, and the plurality of first channel layers are parallel to the inclined surface.

3. The semiconductor device of claim 1, wherein the first electrode and the second electrode are a source electrode and a drain electrode, respectively.

4. The semiconductor device of claim 1, wherein each of the plurality of channel layers comprises a two-dimensional (2D) semiconductor material.

5. The semiconductor device of claim 4, wherein the 2D semiconductor material comprises transition metal dichalcogenide (TMD), black phosphorus, or graphene.

6. The semiconductor device of claim 1, wherein the first electrode and the second electrode each independently comprise a metal, a metal nitride, a metal carbide, polysilicon, or a combination thereof.

7. The semiconductor device of claim 1, further comprising:

a gate insulating layer between the plurality of channel layers and the gate electrode.

8. The semiconductor device of claim 1, wherein the gate electrode comprises at least one of metal, a conductive nitride, or a conductive oxide.

9. The semiconductor device of claim 1, wherein the first electrode and the second electrode are each a source electrode, and the third electrode is a common drain electrode.

10. An electronic device comprising:

the semiconductor device according to claim 1.

11. A semiconductor device comprising:

a substrate;

a first electrode and a second electrode on the substrate and spaced apart from each other in a first direction, the first direction parallel to a bottom surface of the substrate, the first electrode and the second electrode extending in a second direction, the second direction being perpendicular to the bottom surface of the substrate;

a third electrode arranged perpendicular to the substrate;

a plurality of channel layers between the first electrode and the second electrode, the plurality of channel layers being inclined at an angle with respect to the bottom surface of the substrate; and a gate electrode surrounding the plurality of channel layers, wherein the third electrode is between the first electrode and the second electrode, the plurality of channel layers comprise a plurality of first channel layers between the first electrode and the third electrode and a plurality of second channel layers between the second electrode and the third electrode, the plurality of first channel layers and the plurality of second channel layers are symmetrical with respect to the third electrode, and the gate electrode surrounds the plurality of first channel layers and the plurality of second channel layers.

12. The semiconductor device of claim 11, wherein the substrate comprises an inclined surface, and the plurality of first channel layers are parallel to the inclined surface.

13. The semiconductor device of claim 11, wherein the first electrode and the second electrode are a source electrode and a drain electrode, respectively.

14. The semiconductor device of claim 11, wherein each of the plurality of channel layers comprises a two-dimensional (2D) semiconductor material.

15. The semiconductor device of claim 11, wherein each of the plurality of channel layers is symmetric with respect to a center line extending through the plurality of channel layers in a direction crossing the plurality of channel layers.

16. A semiconductor device comprising:

a substrate;

a first electrode and a second electrode on the substrate and spaced apart from each other in a first direction, the first direction parallel to a bottom surface of the substrate, the first electrode and the second electrode extending in a second direction, the second direction being perpendicular to the bottom surface of the substrate;

a plurality of channel layers between the first electrode and the second electrode, the plurality of channel layers being inclined at an angle with respect to the bottom surface of the substrate;

a gate electrode surrounding the plurality of channel layers; and a third electrode arranged perpendicular to a surface of the substrate, wherein the third electrode is between the first electrode and the second electrode, the plurality of channel layers includes a first group of channel layers spaced apart from each other in a vertical direction and a second group of channel layers spaced apart from each other in the vertical direction, opposite ends of channel layers in the first group of channel layers are connected to the first electrode and the third electrode, respectively, opposite ends of channel layers in the second group of channel layers are connected to the third electrode and the second electrode, respectively, and the gate electrode surrounds the first group of channel layers and the second group of channel layers.

17. The semiconductor device of claim 16, wherein the first electrode and the second electrode are each a source electrode, and the third electrode is a common drain electrode.

18. An electronic device comprising:

the semiconductor device according to claim 16.

* * * * *